United States Patent
Yeo et al.

(10) Patent No.: US 10,608,108 B2
(45) Date of Patent: Mar. 31, 2020

(54) EXTENDED DRAIN MOSFETS (EDMOS)

(71) Applicant: GLOBALFOUNDRIES Singapore Pte. Ltd., Singapore (SG)

(72) Inventors: Chia Ching Yeo, Singapore (SG); Khee Yong Lim, Singapore (SG); Kiok Boone Elgin Quek, Singapore (SG); Donald R. Disney, Cupertino, CA (US)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/013,336

(22) Filed: Jun. 20, 2018

(65) Prior Publication Data

US 2019/0393338 A1    Dec. 26, 2019

(51) Int. Cl.
| | |
|---|---|
| *H01L 29/78* | (2006.01) |
| *H01L 29/06* | (2006.01) |
| *H01L 27/12* | (2006.01) |
| *H01L 29/08* | (2006.01) |

(52) U.S. Cl.
CPC ...... *H01L 29/7816* (2013.01); *H01L 27/1203* (2013.01); *H01L 29/0611* (2013.01); *H01L 29/0886* (2013.01)

(58) Field of Classification Search
CPC .......... H01L 29/7816; H01L 29/0611; H01L 29/0886; H01L 27/1203
USPC ........................................................ 257/339
See application file for complete search history.

(56) References Cited

U.S. PATENT DOCUMENTS

| | | | | |
|---|---|---|---|---|
| 2004/0121547 A1* | 6/2004 | Lee | ................. | H01L 21/823462 438/275 |
| 2004/0262685 A1* | 12/2004 | Zingg | ................. | H01L 29/7824 257/347 |
| 2006/0261391 A1* | 11/2006 | Nakazawa | .......... | H01L 27/0255 257/296 |
| 2010/0301411 A1* | 12/2010 | Takeda | ................ | H01L 29/0696 257/335 |
| 2012/0126324 A1* | 5/2012 | Takeda | ................ | H01L 29/0878 257/343 |

OTHER PUBLICATIONS

Litty, A., et al. "Towards high-voltage MOSFETs in ultrathin FDSOI" International Journal of High Speed Electronics and Systems, vol. 25, Nos. 1 & 2, 2016, 21 pages.
Litty, A., et al. "Dual Ground Plane EDMOS in ultrathin FDSOI for 5V energy management application." ESSDERC, 2014 44th European, IEEE, 2014, 4 pages.
Litty, A., et al. "EDMOS in ultrathin FDSOI: Effect of doping and layout of the drift region." ESSDERC, 2015 45th European, IEEE, 2015, 4 pages.

* cited by examiner

*Primary Examiner* — Tu-Tu V Ho
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to extended drain MOSFET structures with a dual oxide thickness and methods of manufacture. The structure includes an extended drain metal oxide semiconductor transistor (EDMOS) comprising a gate structure with a dual oxide scheme.

17 Claims, 4 Drawing Sheets

EXTENDED DRAIN MOSFETS (EDMOS)

FIELD OF THE INVENTION

The present disclosure relates to semiconductor structures and, more particularly, to extended drain MOSFET structures with a dual oxide thickness and methods of manufacture.

BACKGROUND

Metal-oxide-semiconductor field-effect transistors (MOSFETs) are used as high frequency switches which can alternate between an on-state and an off-state. This enables the control of high load power with minimal power dissipation. Although the MOSFET can switch at high speeds due to the absence of minority carrier transport, input capacitance limits its performance.

In conventional extended drain MOS (EDMOS) transistors, the input capacitance is relatively large due to the large gate area and the large overlap between gate and drain regions. Due to this type of configuration, the upper cutoff frequency is usually limited by the charging and discharging of the input capacitance. In addition to the gate-to-source capacitance (CGS), a significant gate-to-drain capacitance (CGD) is known to exist due to the overlap of the gate. If the input capacitance is relatively high, a relatively high gate current is needed to operate the EDMOS. As a result, the gate switching loss will be significant, especially at switching frequencies beyond 1 MHz.

Moreover, in conventional EDMOS on fully depleted silicon on insulator (FDSOI) structures, breakdown at gate stack/drift region is expected to ensue with continuous VB2 increase to modulate drift/drain electric field in a dual ground plane (DGP) device. VB2 refers to the biasing condition of a back-gate underneath the drift region/BOX. This is a highly N-doped implanted ground plane (GP), located in a N-well and connected to a hybrid pad, for example. At this point, the drift region virtually has more doping, and the potential at a gate stack edge will reach its maximum voltage.

Also, breakdown at the oxide occurs and BVdss collapses as the oxide can no longer sustain such a high voltage. BVdss is a breakdown voltage at which the reverse-biased body-drift diode breaks down and significant current starts to flow between the source and drain by the avalanche multiplication process, while the gate and source are shorted together. Currently, maximum BVdss achieved by EDMOS structures on FDSOI is about 11V, limited mainly by electric field at the boundary between gate stack and drift region.

SUMMARY

In an aspect of the disclosure, a structure comprises: an extended drain metal oxide semiconductor transistor (EDMOS) comprising a gate structure with a dual oxide scheme.

In an aspect of the disclosure, a structure comprises: an extended drain metal oxide semiconductor (EDMOS) transistor formed on a fully depleted SOI substrate; and a gate structure with a thicker oxide portion adjacent to a drain side of the gate structure and a thinner oxide portion under a remaining portion of the gate structure.

In an aspect of the disclosure, a method comprises: forming a deep N-well implant in a semiconductor on insulator substrate; forming a channel region of an EDMOS transistor by patterning the semiconductor material and buried insulator material of the semiconductor on insulator substrate followed by an optional epitaxy regrowth process; providing a well implant and drift implant in the channel region; and providing an oxidation process to form a dual oxide schemes for a gate structure of the EDMOS transistor.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to extended drain MOSFET (EDMOS) structures with a dual oxide thickness and methods of manufacture. Advantageously, by implementing the structures described herein, a versatile approach is provided to incorporate EDMOS devices in advanced technology nodes with fully depleted SOI (FDSOI). And, as one of skill in the art would readily appreciate, integrating EDMOS devices on FDSOI addresses high voltage needs in rf/high power applications as core CMOS technologies move into advance nodes where low leakage levels and improved short channel control are required. Also, by implementing the structures herein, there is no need for complicated biasing schemes for ground planes.

In embodiments, the EDMOS device can be built on an ultrathin body and buried oxide fully depleted silicon on insulator (UTBB FDSOI) substrate. The EDMOS device includes a dual oxide scheme to protect BVdss collapse due to high gate stack/drift field. The dual oxide gate stack formation can be provided in UTBB FDSOI, where a thicker oxide is provided near a drain terminal, e.g., formed under a gate at a drain edge of the EDMOS device, to sustain high gate stack/drift electric field, especially when breakdown voltage is greater than 11V. In embodiments, the EDMOS device can be integrated with a low voltage (LV) device or other devices on a FDSOI substrate.

The EDMOS device of the present disclosure can be manufactured in a number of ways using a number of different tools. In general, though, the methodologies and tools are used to form structures with dimensions in the micrometer and nanometer scale. The methodologies, i.e., technologies, employed to manufacture the EDMOS device of the present disclosure have been adopted from integrated circuit (IC) technology. For example, the structures are built on wafers and are realized in films of material patterned by photolithographic processes on the top of a wafer. In particular, the fabrication of the EDMOS device uses three basic building blocks: (i) deposition of thin films of material on a substrate, (ii) applying a patterned mask on top of the films by photolithographic imaging, and (iii) etching the films selectively to the mask.

Figure 1:
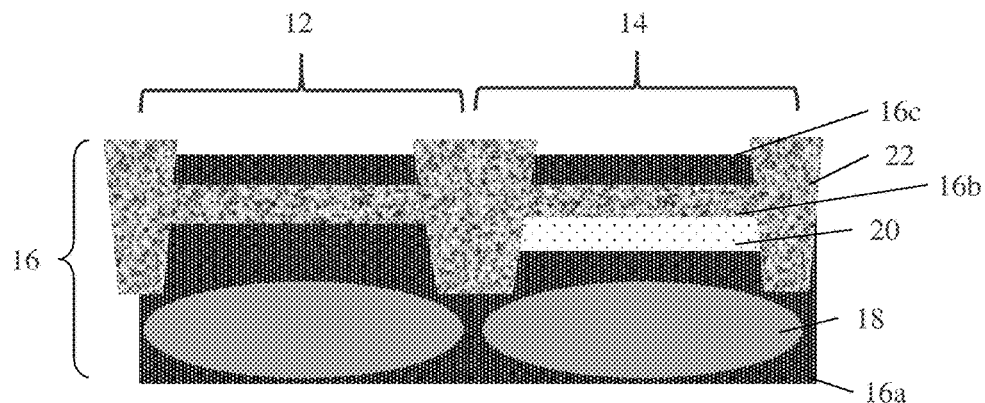
FIG. 1 shows a structure comprising an extended drain MOSFET (EDMOS) region and low voltage device (LV) region, amongst other features, and respective fabrication process in accordance with aspects of the present disclosure.

FIG. 1 shows a structure comprising an EDMOS region and LV (low voltage) region, amongst other features. In particular, the structure 10 shown in FIG. 1 includes both an EDMOS region 12 and LV region 14 composed from semiconductor on insulator (SOI) technologies. In embodiments, the semiconductor on insulator (SOI) technologies 16 include an insulator material 16b bonded to a semiconductor wafer 16a and a semiconductor material 16c (e.g., silicon) bonded to the insulator material 16b. The insulator material 16b can be a buried oxide material with a thickness of about 25 nm or less; whereas, the semiconductor material 16c can be composed of any suitable material including, e.g., Si, SiGe, SiGeC, SiC, etc., having a thickness of about 10 nm or less. It should be appreciated by those of skill in the art that other material thicknesses are contemplated by the present disclosure.

As further shown in FIG. 1, the EDMOS region 12 includes a deep well N+ implant 18 formed by, for example, conventional ion implantation processes followed by a deep diffusion process. The N+ well implant will provide isolation from other devices, e.g., LV device. In embodiments, the implantation process can be provided at typical ion energies in the range of, e.g., higher than 1000 keV and preferably below 2500 keV, using, e.g., phosphorus dopants. The LV region 14 includes a shallow well implant 20 in a top portion of the semiconductor wafer 16a, directly below the insulator layer 16b. In embodiments, the shallow well implant 20 can be implanted at a lower energy, e.g., with Arsenic, Phosphorus or Boron, with energy ranges of about 50 keV to 500 keV.

Still referring to FIG. 1, shallow trench isolation structures 22 are formed through the SOI wafer 16 to separate the EDMOS region 12 and LV region 14. In embodiments, the shallow trench isolation structures 22 can be formed by conventional lithography, etching and deposition methods known to those of skill in the art. For example, a resist formed over the semiconductor material 16c is exposed to energy (light) to form a pattern (opening). An etching process with a selective chemistry, e.g., reactive ion etching (RIE), will be used to form one or more trenches in the semiconductor material 16c through the openings of the resist. The resist can then be removed by a conventional oxygen ashing process or other known stripants. Following the resist removal, insulator material (e.g., oxide) can be deposited by any conventional deposition processes, e.g., chemical vapor deposition (CVD) processes. Any residual material on the surface of the semiconductor material 16c can be removed by conventional chemical mechanical polishing (CMP) processes.

Figure 2:
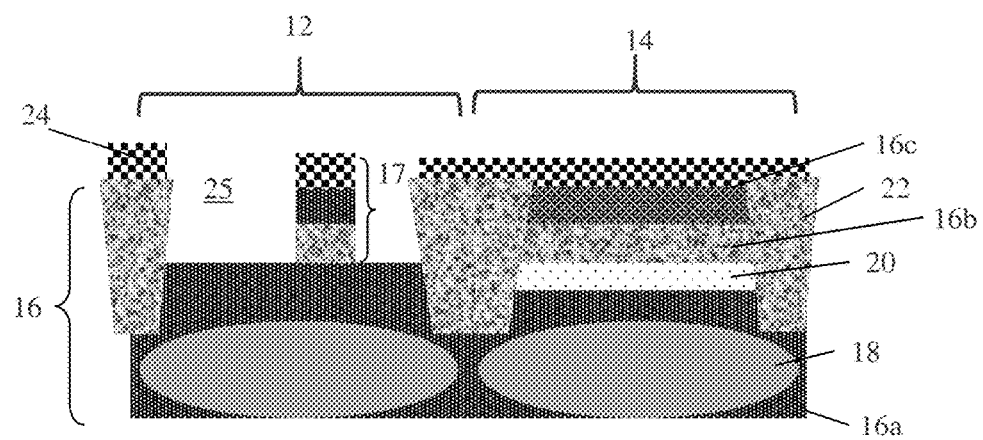
FIG. 2 shows a mesa structure composed of semiconductor material, amongst other features, and respective fabrication process in accordance with aspects of the present disclosure.

In FIG. 2, a mask 24 (e.g., nitride material) is blanket deposited over the EDMOS region 12 and LV region 14, followed by a patterning process using conventional lithography and etching process. By patterning the mask 24, the LV region 14 remains fully protected, whereas, the EDMOS region 12 includes openings 25 exposing portions of the semiconductor material 16c. A timed etching process, e.g., RIE, with a selective chemistry is used to remove materials 16b, 16c through the openings 25, e.g., in the non-capped areas of the EDMOS region 12. In embodiments, the etching process will stop on the wafer material 16a (e.g., semiconductor material). In this way, a mesa 17 composed of the insulator material 16b and semiconductor material 16c is formed in the EDMOS region 12.

Figure 3:
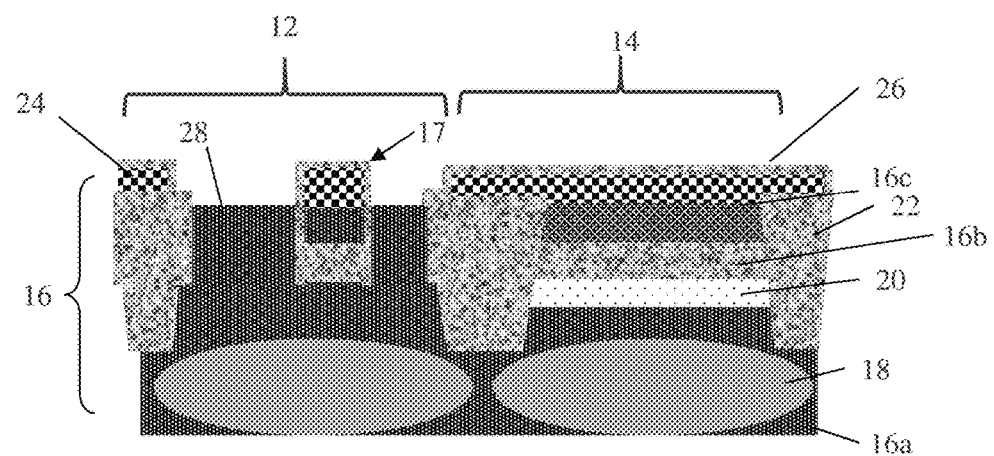
FIG. 3 shows sidewall material on the mesa structure, amongst other features, and respective fabrication process in accordance with aspects of the present disclosure.

Referring now to FIG. 3, a spacer material 26 is formed over the mesa 17 and the mask 24. In embodiments, the spacer material 26 can be an oxide material deposited using conventional spacer oxide formation processes such that no further explanation is required for a complete understanding of the present disclosure. Following the spacer oxide formation, an optional epitaxial growth of semiconductor material 28 is performed on the exposed semiconductor material 16c using epitaxial growth processes. The semiconductor material 28 can be grown to a thickness of about 35 nm or less, and preferably to a same height as the semiconductor material 16c on the LV region 14 (which still remains protected by the mask 24). In embodiments, the channel region of the EDMOS device is formed by the patterning of the semiconductor layer 16c and insulator layer 16b in combination with the epitaxial growth of the semiconductor material 28.

Figure 4:
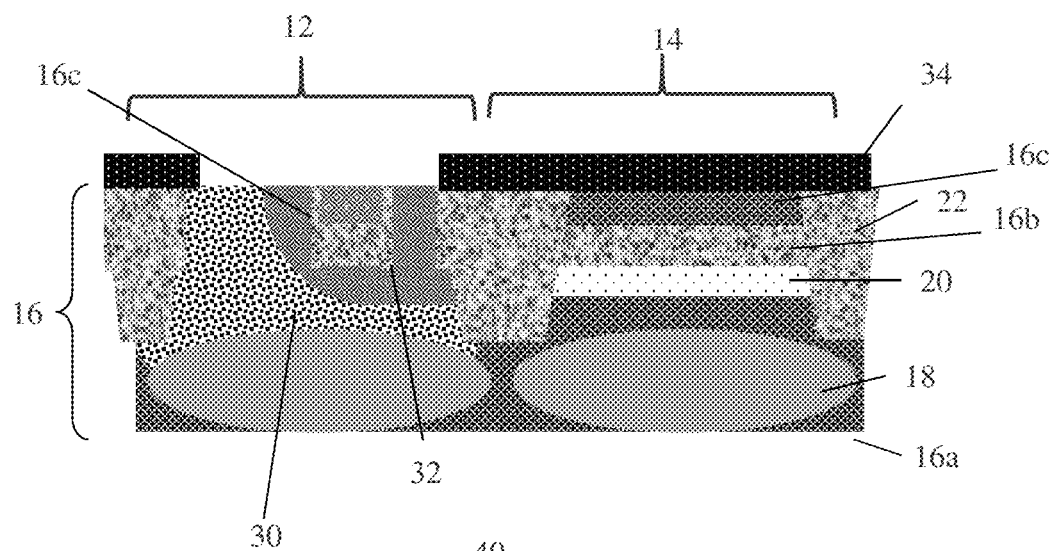
FIG. 4 shows well implant regions around the mesa structure, amongst other features, and respective fabrication process in accordance with aspects of the present disclosure.

As shown in FIG. 4, following the removal of the mask 24, a planarization process, e.g., chemical mechanical polishing (CMP), is used to expose the semiconductor material 16c of the mesa 17. A mask 34 is then deposited and patterned over the EDMOS region 12 and LV region 14, providing an opening which exposes the semiconductor material 16c of the mesa 17 and surrounding areas of the EDMOS region 12. The exposed regions of the EDMOS region 12, e.g., semiconductor material 16c and surrounding area, undergo an implantation process to form a well implant region 30 and drift implant region 32, while the LV region 14 and remaining portions of the EDMOS region 12 remain protected from the implantation processes. As should be understood by those of skill in the art, the well implant region 30 provides channel control and the drift implant region is for graded junction formation. In embodiments, the well implant region 30 and the drift implant region 32 can be formed by an ion implantation process at, e.g., dopant for well region is Boron or $BF_2$ or a combination thereof with energy ranging from about 20 kev to 250 keV. The dopant for the drift region is usually Phosphorus, with energy ranging from about 10 keV to 150 keV.

Figure 5:
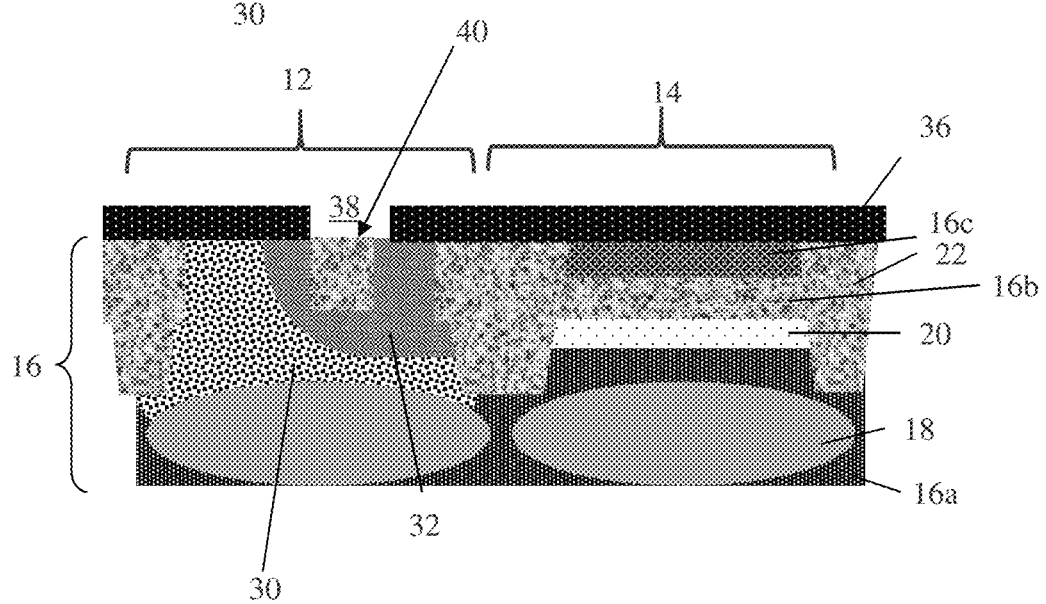
FIG. 5 shows a silicon dioxide mesa, amongst other features, and respective fabrication process in accordance with aspects of the present disclosure.

In FIG. 5, a mask 36, e.g., silicon nitride, is deposited and patterned over the EDMOS region 12 and the LV region 14 to form an opening 38 exposing the doped semiconductor material 16c of the mesa 17. The exposed doped semiconductor material 16c undergoes an oxidation process to form a silicon dioxide mesa 40. For example, the oxidation process converts silicon (e.g., semiconductor material 16c) into silicon dioxide thereby forming a thick oxide layer (which will be located at an edge of the gate structure for the EDMOS device). For an effective oxidation rate, the structure can be placed in a furnace with oxygen or water vapor at elevated temperatures as should be understood by those of skill in the art. In optional embodiments, prior to the oxidation process, the exposed semiconductor material 16c can undergo a high doping implantation process, e.g., dopant includes Arsenic in order of E15, with an energy range of about 15 keV to 25 keV, to improve the oxidation process.

Figure 6:
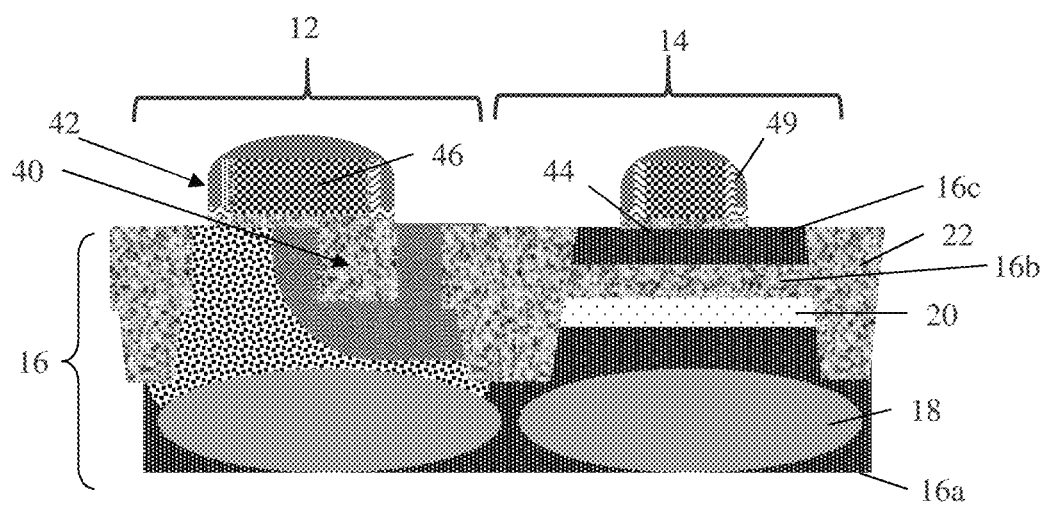
FIG. 6 shows gate structures formed in an EDMOS region and an LV region with the gate structure in the EDMOS having a dual oxide scheme, amongst other features, and respective fabrication process in accordance with aspects of the present disclosure.

As shown in FIG. 6, gate structures 42 are formed on the EDMOS region 12 and the LV region 14 using conventional gate formation processes, e.g., deposition and patterning processes. For example, following the removal of the mask 36 shown in FIG. 5, the EDMOS region 12 and the LV region 14 undergo an oxidation process to form a gate dielectric material 44. In embodiments, the gate dielectric material 44 can also be deposited by a blanket deposition process, e.g., atomic layer deposition (ALD) or plasma enhanced chemical deposition (PECD). The gate dielectric material 44 can a $SiO_2$ or a high-k gate dielectric material, e.g., HfOx, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Still referring to FIG. 6, a polysilicon material 46 is blanket deposited on the gate dielectric material 44 using a conventional deposition process, e.g., CVD process. In embodiments, the polysilicon material 46 can be pre-doped poly gate material. In alternative embodiments, for 28 nm and beyond technologies, the gate material can include polysilicon solely, or combination of polysilicon with a thin metal underneath. In embodiments, the metal is at an interface with the gate oxide. The type of metal will depend on the oxide material as should be understood by those of skill in the art.

The gate dielectric material 44 and the polysilicon material 46 are then patterned to form the gate structures 42. The gate structures 42 in the EDMOS region 12 will overlap with the silicon dioxide mesa 40 resulting in a thicker oxide formed under the gate structure 42 at the drain edge. Moreover, the silicon dioxide mesa 40 will provide a thicker oxide layer under the gate structure in the EDMOS region 12, compared to the LV region 14.

FIG. 6 further shows sidewalls/spacers 49 formed on the gate structures 42, e.g., gate dielectric material 44 and polysilicon material 46. The sidewalls/spacers 49 can be formed by separate deposition steps of insulator material, e.g., oxide, nitride, etc., followed by an anisotropic etching process to remove the insulator material from horizontal surfaces on the EDMOS region 12 and the LV region 14. In embodiments (as shown in FIG. 6), the polysilicon material 46 can first be patterned, followed by the deposition of the sidewall/spacer materials, and etching of the sidewall/spacer materials and gate dielectric material 44.

Figure 7:
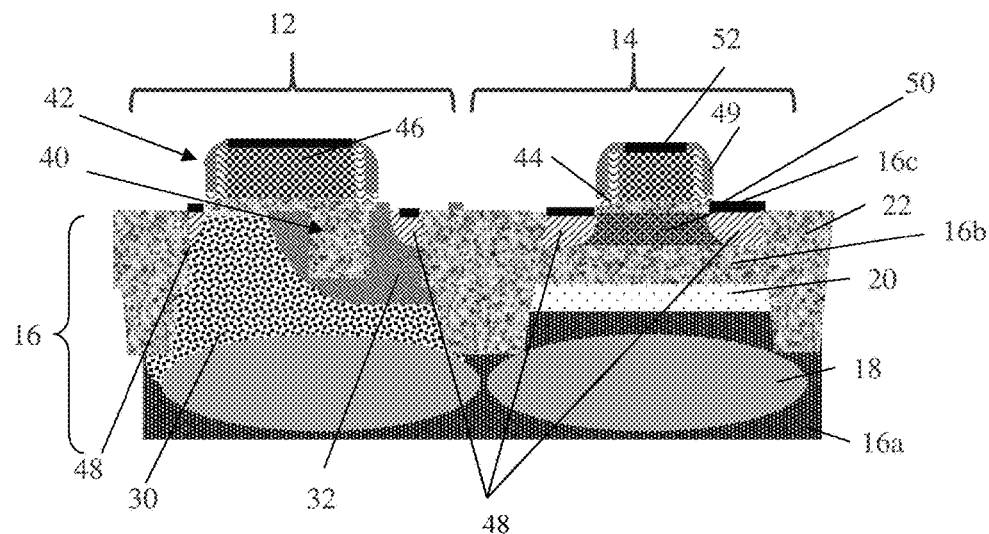
FIG. 7 shows contact formation on the gate structures and source/drain regions, amongst other features, and respective fabrication process in accordance with aspects of the present disclosure.

In FIG. 7, source and drain regions 48 are formed on sides of the gate structures 42 using conventional doping processes such that no further explanation is required for an understanding of the present disclosure. In embodiments, the source and drain regions 48 can be raised source and drain regions formed by an epitaxial growth process. Source and drain silicide 50 are formed on the source and drain regions 48 and gate silicide 52 are formed on the polysilicon material 46 of the gate structures 42. In embodiments, the drift region 32 extends from the gate structure 42 to the silicide 50 on the drain side of the device.

The silicide 50, 52 can be formed in a single silicide process. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 48 and respective devices 42). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide 50, 52 in the active regions of the device. It should be understood by those of skill in the art that silicide contacts will not be required on the devices, when a gate structure is composed of a metal material. In embodiments, the drain side of the gate has portions which are unsalicided, which is in the region of the thicker oxide (e.g., mesa 40). This region can include the space between oxide and the silicide 50, as well as on top of thick oxide. Accordingly, the silicided region is pulled away from channel.

Figure 8:
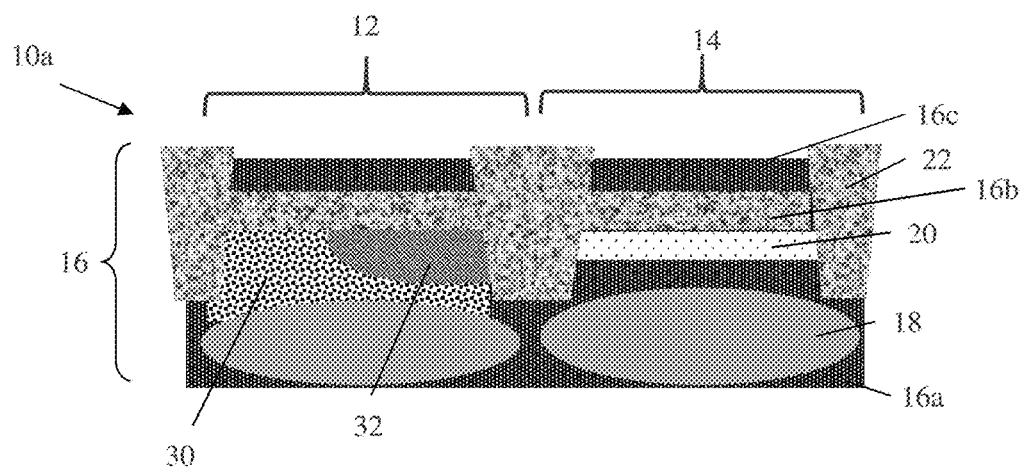
FIGS. 8-11 show an alternative structure and respective fabrication processes in accordance with aspects of the present disclosure.

FIGS. 8-11 show an alternative structure and respective fabrication processes in accordance with aspects of the present disclosure. Specifically, FIG. 8 shows a structure 10a with the well implant 30 and drift implant 32 in the EDMOS region 12. The remaining features, e.g., SOI wafer 16, deep N+ well implants 18, STI regions 22, LV well implant 20, etc., remain the same as the structure of FIG. 1.

Figure 9:
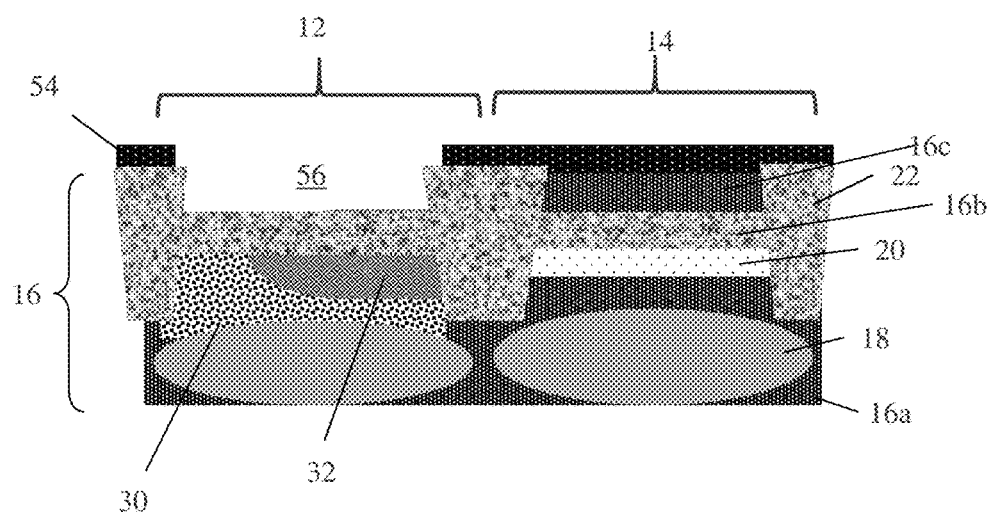

In FIG. 9, a mask 54 is deposited and patterned over the EDMOS region 12 and the LV region 14. More specifically, in embodiments, a nitride mask 54 is blanket deposited over the EDMOS region 12 and LV region 14, followed by a patterning process using conventional lithography and etching processes. By patterning the mask 54, the LV region 14 remains fully protected, whereas, the EDMOS region 12 includes opening 56 which exposes portions of the semiconductor material 16c. A timed etching process, e.g., RIE, with a selective chemistry is used to remove the exposed semiconductor material 16c, stopping on the insulator material 16b. In this way, the insulator layer 16b is now exposed.

Figure 10:
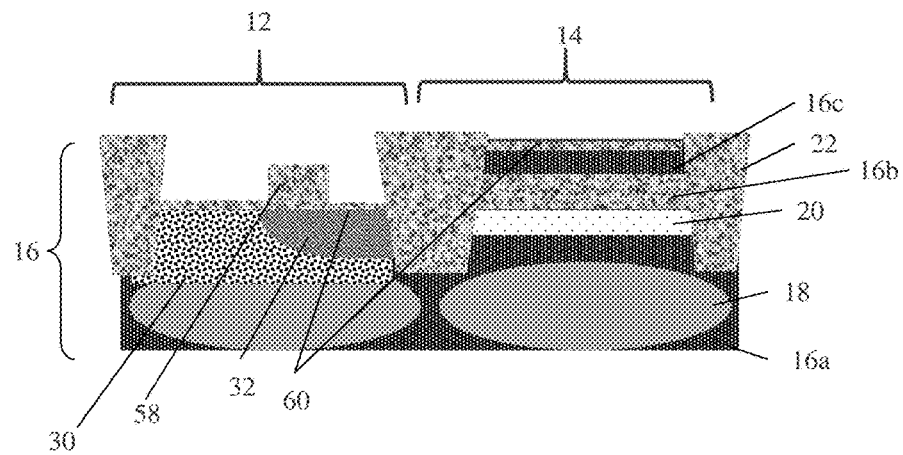

As shown representatively in FIG. 10, a portion of the insulator material 16b in the EDMOS region 12 is patterned, e.g., removed, to expose the underlying semiconductor material 16a and to form a mesa 58 composed of the insulator material 16b. In embodiments, the patterning is performed by depositing and patterning a mask in the EDMOS region 12 and the LV region 14, followed by an etching process (RIE) to pattern the exposed portions of the insulator material 16b (while remaining portions of the structure remain protected by the mask). The mask is then removed from the EDMOS region 12 and the LV region 14, followed by an oxidation process of the exposed semiconductor materials 16a, 16c. Similar to that described with respect to FIG. 5, the oxidation process will form a thin layer of oxide material 60 in both the EDMOS region 12 and the LV region 14. The mesa 58 composed of the insulator material 16b is thicker than the oxidized layer 60.

Figure 11:
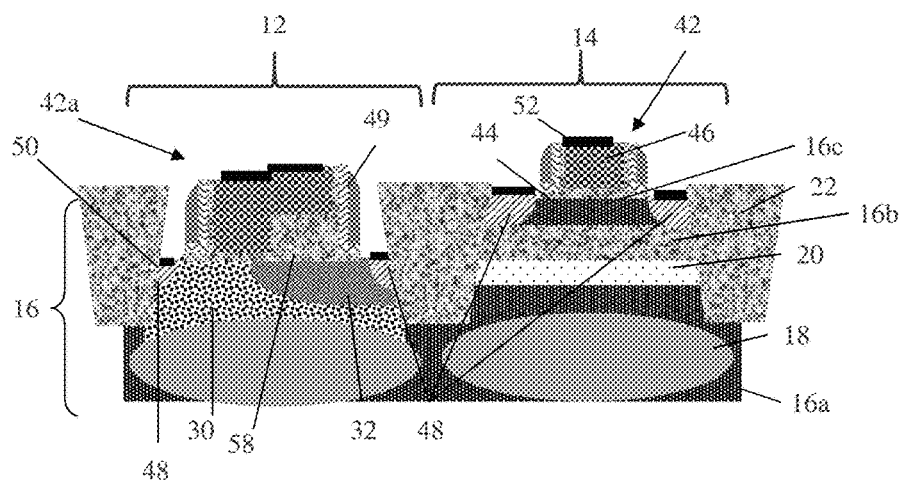

In FIG. 11, gate structures 42 are formed in the EDMOS region 12 and the LV region 14 using conventional deposition and patterning processes. For example, after the oxidation process to form a thicker oxide layer (e.g., mesa 58) in the EDMOS region 12, a polysilicon material 46 is blanket deposited on the oxide layer (e.g., gate dielectric material) 58, 60 using a conventional deposition process, e.g., CVD process. In embodiments, the polysilicon material 46 can be doped after the deposition process. The gate dielectric material 58 and the polysilicon material 46 are then patterned to form the gate structures 42. The gate structures 42 in the EDMOS region 12 will overlap with the silicon dioxide mesa 58, resulting in a thicker oxide under the gate structure 42 at the drain edge in the EDMOS region 12. Also, in this embodiment, the EDMOS region 12 will have a dual height gate (stepped) structure 42a.

As further shown in FIG. 11, sidewalls/spacers 49 are formed on the gate structures 42, e.g., gate dielectric material 58 and polysilicon material 46. The sidewalls/spacers 49 can be formed by a deposition of insulator material, e.g., oxide, nitride, etc., followed by an anisotropic etching process to remove the insulator material from horizontal surfaces on the EDMOS region 12 and the LV region 14. The source and drain regions 48 are formed on sides of the gate structures 42 using conventional doping processes as already described herein such that no further explanation is required for an understanding of the present disclosure. Source and drain silicide 50 and gate silicide 52 are formed using a silicide process as already described herein. In embodiments, the drain side of the gate has portions which are unsalicided, which is in the region of the thicker oxide as already described herein. Similar to that shown in FIG. 7, the region can include the space between oxide and silicide 50, as well as on top of thick oxide. Accordingly, the silicided region is pulled away from channel.

Figure 12:
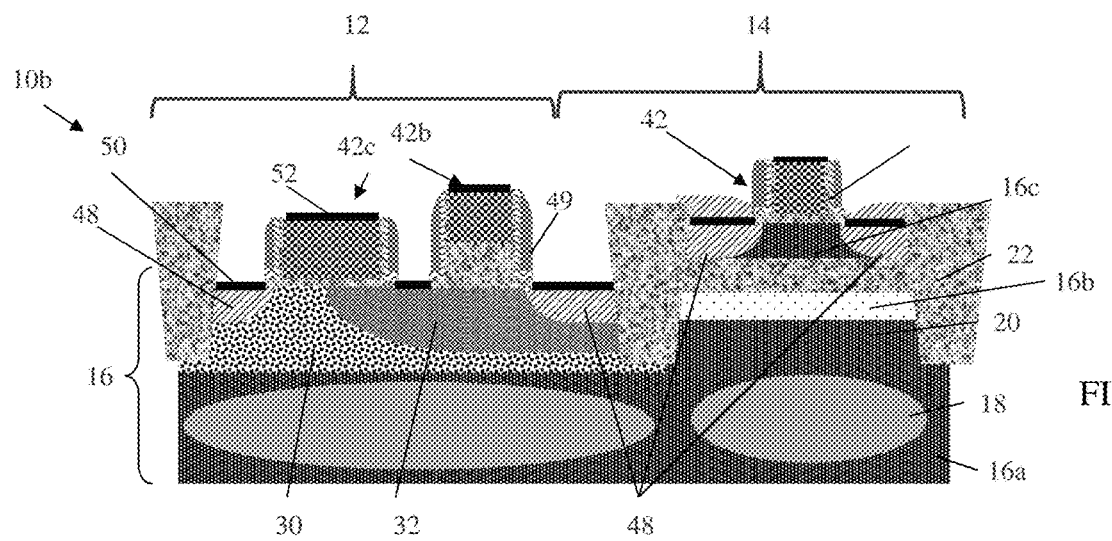
FIG. 12 shows an alternative structure and respective fabrication processes in accordance with aspects of the present disclosure.

FIG. 12 shows an alternative structure and respective fabrication processes in accordance with aspects of the present disclosure. Specifically, in FIG. 12 the structure 10b shows a dummy gate structure 42b separated from an active gate structure 42c in the EDMOS region 12. The dummy gate structure 42b is formed on the mesa 60 (e.g., thicker oxide layer). The remaining features of the structure 10b are similar to that already described with respect to FIG. 11. In addition, the structure shown in FIG. 12 can be fabricated in a similar manner as that described with respect to FIGS. 8-11, with the exception that the mask used to pattern the stepped gate structure of FIG. 11 will now include two openings in order to separate the dummy gate structure 42b from the active gate structure 42c.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an extended drain metal oxide semiconductor (EDMOS) transistor comprising a gate structure with a dual oxide scheme comprising a thicker oxide portion and a thinner oxide portion under the gate structure, and a drift region partly under the gate structure extending from the thicker oxide portion to underneath a drain region of the gate structure, wherein the EDMOS transistor is on a fully depleted SOI substrate.

2. The structure of claim 1, wherein the thicker oxide portion is formed under the gate structure at a drain edge.

3. The structure of claim 1, wherein the thicker oxide portion is surrounded by the drift region.

4. The structure of claim 3, wherein the drift region extends from the gate structure to a contact at a drain side of the gate structure.

5. The structure of claim 4, wherein the drain side of the gate structure has portions which are silicided and portions away from a channel region of the gate structure which are unsalicided.

6. The structure of claim 1, further comprising an asymmetrical source region and drain region, in which deeper drift implant dopants are implanted into drain region only.

7. The structure of claim 1, further comprising a low voltage device that is integrated with the EDMOS transistor on the fully depleted SOI substrate.

8. The structure of claim 1, wherein the dual oxide scheme includes a mesa of silicon oxide which is buried in the drift region that extends partly under the gate structure.

9. The structure of claim 1, wherein the dual oxide scheme is a stepped feature of silicon oxide.

10. The structure of claim 1, wherein the dual oxide scheme includes a dummy gate structure on an oxide layer thicker than an oxide layer of a gate structure of the EDMOS transistor.

11. The structure of claim 1, wherein the thicker oxide portion includes a mesa of silicon oxide and a gate dielectric material, the gate dielectric material completely spanning a channel region of the gate structure and the mesa is partly under the gate structure and extends underneath the gate dielectric material at the drain side of the gate structure, the mesa is remote from a drain region, and the drain region is partly silicided with an unsalicided portion closest to the mesa and which separates the gate structure from the silicide.

12. A structure comprising:
an extended drain metal oxide semiconductor (EDMOS) transistor formed on a fully depleted SOT substrate; and
a gate structure with a thicker oxide portion adjacent to a drain side of the gate structure and a thinner oxide portion under a remaining portion of the gate structure, wherein the drain side includes a partially silicided region and an unsalicided region located at the thicker oxide region such that the silicide region is pulled away from a channel region of the gate structure on the drain side.

13. The structure of claim 12, wherein the thicker oxide portion is surrounded by a drift region extending from the gate structure to a contact at drain side of the gate structure.

14. The structure of claim 13, wherein the thicker oxide portion is a mesa of silicon oxide surrounded by the drift region or a stepped feature of silicon oxide.

15. The structure of claim 12, further comprising a low voltage device that is integrated with the EDMOS transistor on the fully depleted SOI substrate.

16. The structure of claim 12, wherein the thicker oxide portion is under a dummy gate structure of the EDMOS transistor.

17. A structure comprising an extended drain metal oxide semiconductor (EDMOS) transistor comprising a gate structure with a dual oxide scheme comprising a thicker oxide portion and a thinner oxide portion under the gate structure, and a drift region partly under the gate structure extending from the thicker oxide portion to underneath a drain region of the gate structure, wherein the dual oxide scheme includes a mesa of silicon oxide and a gate dielectric material, the gate dielectric material completely spanning a channel region of the gate structure and the mesa is partly under the gate structure and extends underneath the gate dielectric material at a drain side of the gate structure, the mesa is remote from the drain region, and the drain region is partly silicided with an unsalicided portion closest to the mesa and which separates the gate structure from the silicide.

* * * * *

UNITED STATES PATENT AND TRADEMARK OFFICE
CERTIFICATE OF CORRECTION

PATENT NO. : 10,608,108 B2
APPLICATION NO. : 16/013336
DATED : March 31, 2020
INVENTOR(S) : Chia Ching Yeo It is certified that error appears in the above-identified patent and that said Letters Patent is hereby corrected as shown below:

In the Claims

Claim 12, Line 49 Column 8, change "SOT" to "SOI".

Signed and Sealed this
Seventh Day of July, 2020

Andrei Iancu
*Director of the United States Patent and Trademark Office*